United States Patent
Kumar et al.

(10) Patent No.: US 8,049,562 B2
(45) Date of Patent: Nov. 1, 2011

(54) AMPLIFIER WITH IMPROVED INPUT RESISTANCE AND CONTROLLED COMMON MODE

(75) Inventors: Rakesh Kumar, Ghazipur (IN); Gireesh Rajendran, Trivandrum (IN); Rittu Sachdev Singh, Nagpur (IN)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 12/683,431

(22) Filed: Jan. 7, 2010

(65) Prior Publication Data
US 2011/0163808 A1 Jul. 7, 2011

(51) Int. Cl.
*H03F 3/45* (2006.01)
(52) U.S. Cl. ........................ 330/258; 330/253
(58) Field of Classification Search ........... 330/252–261
See application file for complete search history.

(56) References Cited

U.S. PATENT DOCUMENTS
2009/0243727 A1* 10/2009 Bockelman et al. .......... 330/285
* cited by examiner

*Primary Examiner* — Hieu P Nguyen
(74) *Attorney, Agent, or Firm* — Wade J. Brady, III; Frederick J. Telecky, Jr.

(57) ABSTRACT

An amplifier includes a first pair of transistors (the first pair) that defines a first output, each transistor of the first pair having a gate coupled to a first input terminal; a second pair of transistors (the second pair) that defines a second output, each transistor of the second pair having a gate coupled to a second input terminal; a first capacitor coupled to the second output terminal and to the gate of a first transistor of the first pair; a second capacitor coupled to the second output terminal and to the gate of a second transistor of the first pair; a third capacitor coupled to the first output terminal and to the gate of a third transistor of the second pair; and a fourth capacitor coupled to the first output terminal and to the gate of a fourth transistor of the second pair.

9 Claims, 7 Drawing Sheets

AMPLIFIER WITH IMPROVED INPUT RESISTANCE AND CONTROLLED COMMON MODE

TECHNICAL FIELD

Embodiments of the disclosure relate to an amplifier.

BACKGROUND

A radio frequency (RF) amplifier is a device used to amplify RF signals in several applications, for example wireless receiver applications. The RF amplifier is coupled between an input circuit, for example a low noise amplifier (LNA), and a mixer to prevent the mixer from loading the LNA.

An exemplary RF amplifier 100, hereinafter referred to as the amplifier 100, is illustrated in FIG. 1 (Prior Art). An output (Vin+ and Vin−) of the LNA is coupled to gates of a transistor 105, a transistor 110, a transistor 115, and a transistor 120 through capacitors, for example a capacitor 125 (Cac), a capacitor 130 (Cac), a capacitor 135 (Cac), and a capacitor 140 (Cac), respectively. In order to prevent the amplifier 100 from loading the LNA and degrading quality factor, the amplifier 100 requires a specific input resistance. Equation (1) illustrates the input resistance of the amplifier 100.

$$Rin = real\left[\frac{1}{(1 + gm \times Zo) \times s \times Cp}\right] \quad (1)$$

where gm is transconductance of the amplifier 100, Zo is impedance of a load 145, s represents complex frequency and can be determined as $s=j*2*pi*f$, where f is frequency, and Cp (Cpp+Cpn) is equivalent parasitic capacitance of either the transistor 105 and the transistor 110 or the transistor 115 and the transistor 120.

The parasitic capacitances of the transistor 105 and the transistor 110 are represented as a parasitic capacitor 150 (Cpp) and a parasitic capacitor 155 (Cpn). The parasitic capacitances of the transistor 115 and the transistor 120 are represented as a parasitic capacitor 160 (Cpp) and a parasitic capacitor 165 (Cpn). The parasitic capacitance degrades the input resistance of the amplifier 100 in presence of the load 145. The input resistance of the amplifier 100 also gets degraded when a phase delay from an input (Vin+ and Vin−) to an output (Vo+ and Vo−) deviates by 180 degrees. The degradation in the input resistance loads the LNA and affects gain, frequency selectivity and noise performance of the LNA.

In light of the foregoing discussion, there is a need to prevent loading of the LNA. Further, there is also a need to maintain a common mode voltage associated with the output of the amplifier 100 within a desired range to improve linearity.

SUMMARY

An example of an amplifier includes a first pair of transistors that defines a first output. Each transistor of the first pair of transistors has a gate coupled to a first input terminal. The amplifier also includes a second pair of transistors that defines a second output. Each transistor of the second pair of transistors has a gate coupled to a second input terminal. The amplifier further includes a first pair of capacitors that minimizes degradation of input resistance at the first input terminal and a second pair of capacitors that minimizes degradation of the input resistance at the second input terminal. A first capacitor of the first pair of capacitors is coupled to the second output terminal and to the gate of a first transistor of the first pair of transistors. A second capacitor of the first pair of capacitors is coupled to the second output terminal and to the gate of a second transistor of the first pair of transistors. A third capacitor of the second pair of capacitors is coupled to the first output terminal and to the gate of a third transistor of the second pair of transistors. A fourth capacitor of the second pair of capacitors is coupled to the first output terminal and to the gate of a fourth transistor of the second pair of transistors.

An example of a control circuit for controlling a common mode voltage associated with an output of a circuit includes a comparator coupled to the circuit to compare the common mode voltage with a reference voltage. A digital to analog converter (DAC) is coupled to the comparator. The DAC is responsive to a transition at a comparator output to configure the DAC to a setting corresponding to the transition. A biasing element is coupled to the circuit and to the DAC. The biasing element enables biasing of the circuit based on the setting, thereby controlling the common mode voltage.

An example of a method for controlling a common mode voltage of a circuit includes comparing the common mode voltage with a reference voltage. The method also includes configuring a digital to analog converter (DAC) to a setting based on the comparing. The method further includes biasing the circuit based on the setting.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
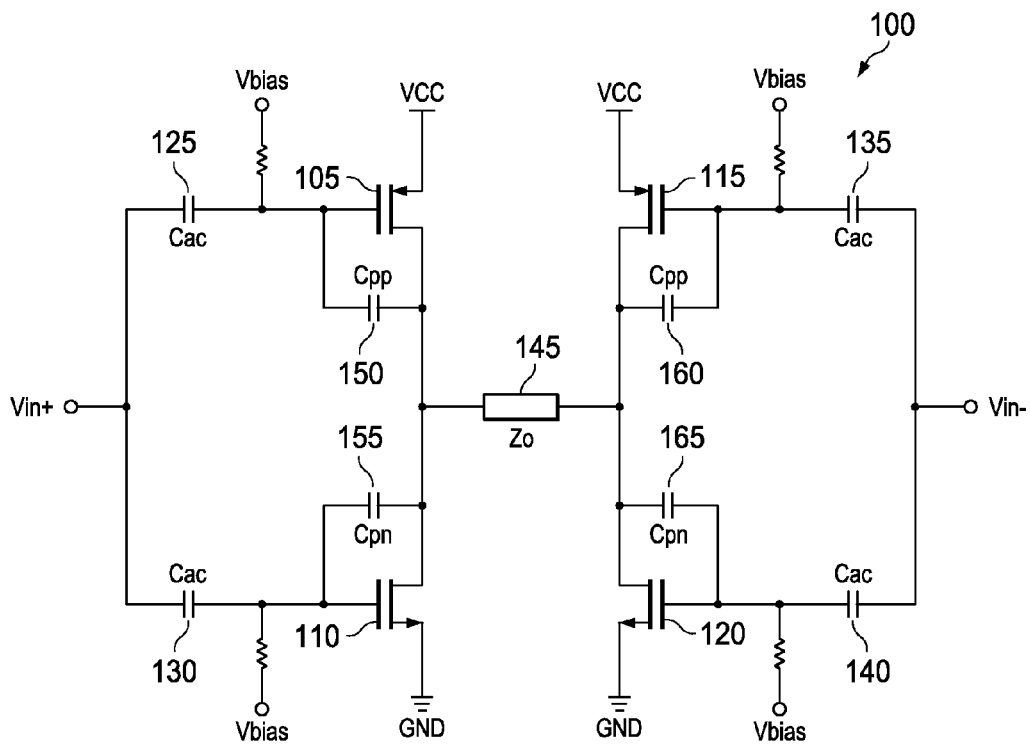
FIG. 1 illustrates an amplifier, in accordance with prior art.
Figure 2:
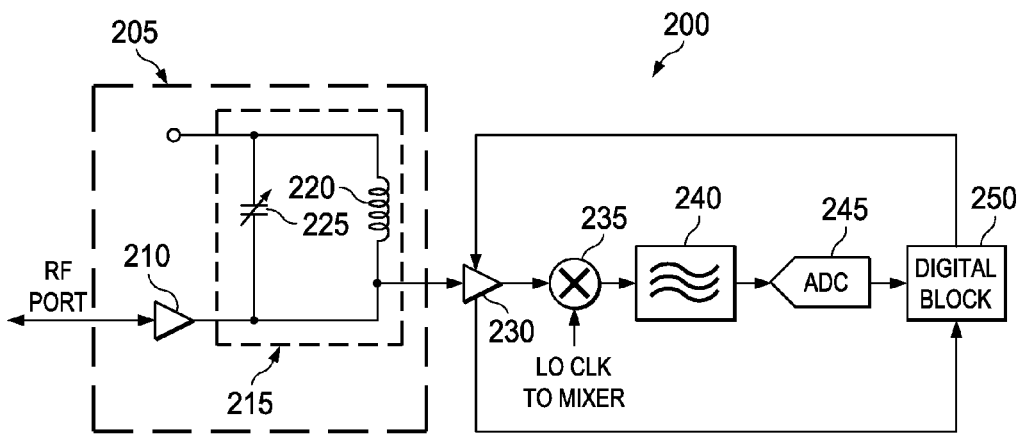
FIG. 2 illustrates an environment, in accordance with one embodiment.

FIG. 2 illustrates an environment 200, for example a wireless receiver. The environment 200 includes an input circuit 205, an amplifier 230, a mixer 235, a filter 240, an analog-to-digital converter (ADC) 245, and a digital block 250. The input circuit 205 can include a low noise amplifier (LNA) 210 and a tuning circuit 215. The tuning circuit 215 is coupled to an output of the LNA 210, and includes an inductor 220 and a capacitor 225 coupled in a parallel connection. The tuning circuit 215 provides a voltage gain for in-band signals and rejects out-of-band signals. The amplifier 230, for example an RF amplifier, is coupled between the input circuit 205 and the mixer 235 to prevent loading of the input circuit 205. The mixer 235 can be a multiplying mixer that multiplies inputs from an oscillator clock and from the amplifier 230 to provide an output signal. The output signal from the mixer 235 is further sent to the filter 240. The filter 240 can be an intermediate frequency filter that converts the output signal to an intermediate frequency signal. The intermediate frequency signal is provided to the ADC 245 which converts the intermediate frequency signal to a digital output. The digital block 250 receives the digital output to perform various operations. The digital block 250 can include a clock circuit and a counter. The digital block 250 is further coupled to the amplifier 230 to receive an input and provide an output to control a common mode voltage of the amplifier 230.

In some embodiments, the input circuit 205 can be one stage of several stages of a multistage amplifier circuit that provides input to the amplifier 230. The amplifier 230 can then be referred to as an output stage amplifier of the multistage amplifier circuit, and the input circuit 205 and the amplifier 230 can together be referred to as the multistage amplifier circuit.

The input circuit 205 can provide differential output to the amplifier 230. The differential output of the input circuit 205 can be referred to as an input to the amplifier 230. The amplifier 230 amplifies the input and reduces the loading of the input circuit 205. In order to prevent the amplifier 230 from loading the input circuit 205 and degrading quality factor, the amplifier 230 needs to have high input resistance.

Figure 3:
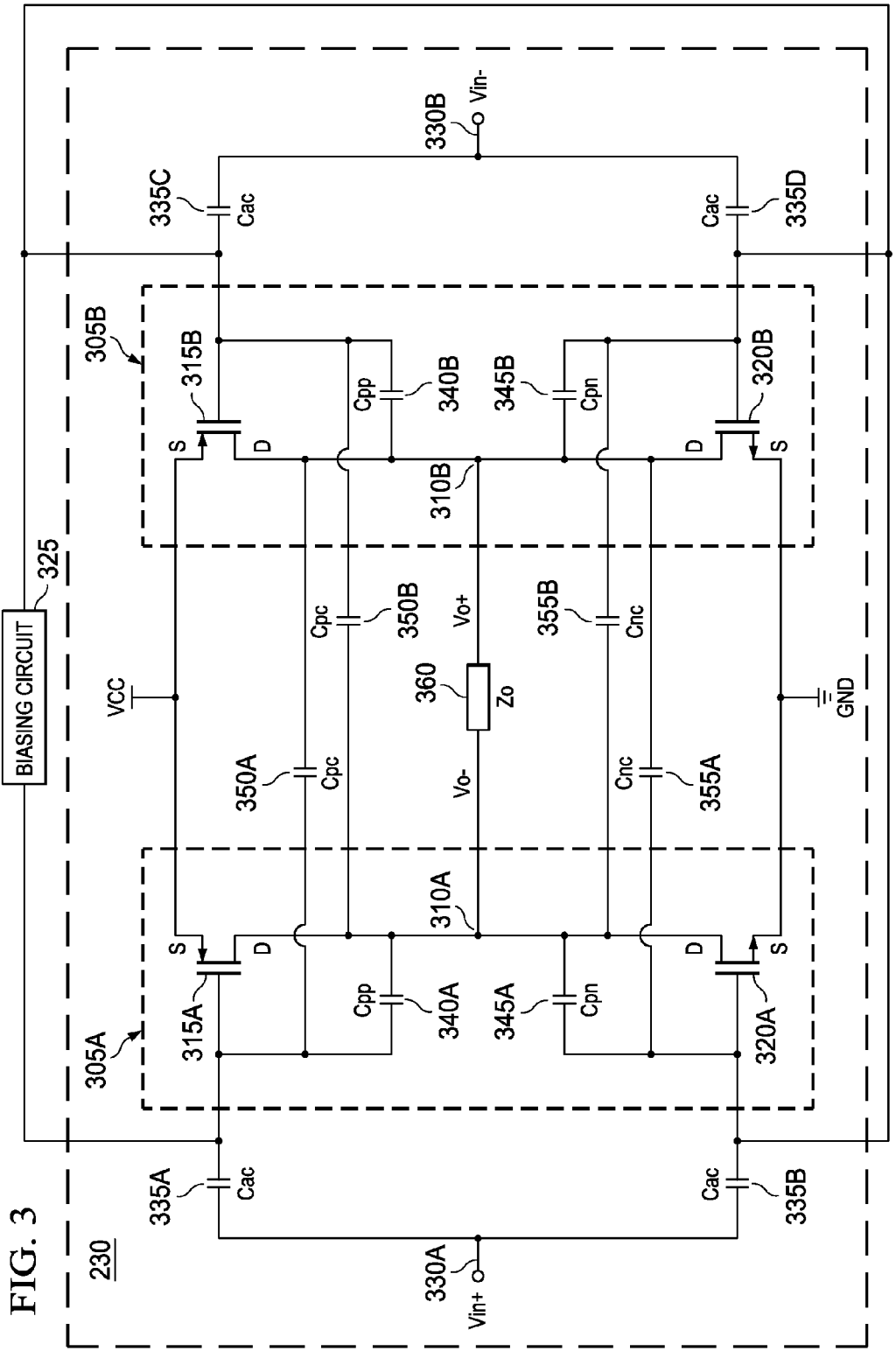
FIG. 3 illustrates an amplifier, in accordance with one embodiment.

Referring now to FIG. 3, the amplifier 230 includes a first pair of transistors 305A, hereinafter referred to as the pair 305A. The pair 305A is responsive to the input (Vin+) to define a first output (Vo−) at a first output terminal 310A, hereinafter referred to as the output terminal 310A. The pair 305A includes a first transistor 315A, hereinafter referred to as the transistor 315A, and a second transistor 320A, hereinafter referred to as the transistor 320A. The transistor 315A has a gate coupled to a biasing circuit 325 and to a first input terminal 330A, hereinafter referred to as the input terminal 330A, through a capacitor 335A (Cac), a source (S) coupled to a voltage supply (VCC), and a drain (D) coupled to a drain (D) of the transistor 320A. The transistor 320A has a gate coupled to the biasing circuit 325 and to the input terminal 330A through a capacitor 335B (Cac), and a source (S) coupled to a ground supply (GND). Parasitic capacitances of the transistor 315A and the transistor 320A are represented as a parasitic capacitor 340A (Cpp) and a parasitic capacitor 345A (Cpn).

The amplifier 230 also includes a second pair of transistors 305B, hereinafter referred to as the pair 305B. The pair 305B is responsive to the input (Vin−) to define a second output (Vo+) at a second output terminal 310B, hereinafter referred to as the output terminal 310B. The pair 305B includes a third transistor 315B, hereinafter referred to as the transistor 315B, and a fourth transistor 320B, hereinafter referred to as the transistor 320B. The transistor 315B has a gate coupled to the biasing circuit 325 and to a second input terminal 330B, hereinafter referred to as the input terminal 330B, through a capacitor 335C (Cac), a source coupled to the voltage supply (VCC), and a drain coupled to a drain of the transistor 320B. The transistor 320B has a gate coupled to the biasing circuit 325 and to the input terminal 330B through a capacitor 335D (Cac), and a source coupled to the ground supply (GND). The parasitic capacitances of the transistor 315B and the transistor 320B are represented as a parasitic capacitor 340B (Cpp) and a parasitic capacitor 345B (Cpn).

The amplifier 230 further includes a first pair of capacitors that minimizes degradation of the input resistance at the input terminal 330A. The first pair of capacitors includes a first capacitor 350A (Cpc), hereinafter referred to as the capacitor 350A, and a second capacitor 355A (Cnc), hereinafter referred to as the capacitor 355A. One terminal (negative plate) of the capacitor 350A is coupled to the gate of the transistor 315A and other terminal (positive plate) is coupled to the drain of the transistor 315B. One terminal (negative plate) of the capacitor 355A is coupled to the gate of the transistor 320A and other terminal (positive plate) is coupled to the drain of the transistor 320B.

The amplifier 230 also includes a second pair of capacitors that minimizes degradation of the input resistance at the input terminal 330B. The second pair of capacitors includes a third capacitor 350B (Cpc), hereinafter referred to as the capacitor 350B, and a fourth capacitor 355B (Cnc), hereinafter referred to as the capacitor 355B. One terminal (negative plate) of the capacitor 350B is coupled to the drain of the transistor 315A and other terminal (positive plate) is coupled to the gate of the transistor 315B. One terminal (negative plate) of the capacitor 355B is coupled to the drain of the transistor 320A and other terminal (positive plate) is coupled to the gate of the transistor 320B.

The amplifier 230 includes the biasing circuit 325. The biasing circuit 325 can include a pair of diodes, and a pair of current sources coupled to the diodes. The diodes can be transistor based diodes.

The current sources can include at least one digital-to-analog converter (DAC) that controls a common mode voltage associated with the first output (Vo−) and the second output (Vo+). The common mode voltage ($[(Vo+)+(Vo-)]/2$) can be determined as an average of the first output and the second output.

The amplifier 230 can also include a comparator coupled to the output terminal 310A and the output terminal 310B. The comparator compares the common mode voltage with a reference voltage.

The amplifier 230 can be coupled to a load 360 (Zo) via the output terminal 310A and the output terminal 310B.

In some embodiments, the capacitor 350A, the capacitor 355A, the capacitor 350B and the capacitor 355B can be identical in size and capacitances. The capacitor 335A, the capacitor 335B, the capacitor 335C, and the capacitor 335D can be alternating current (AC) coupled capacitors and can also be identical.

In some embodiments, a combination of capacitors (four capacitors) can be selected such that correction capacitances of the capacitors satisfy a predefined criterion. For example, in one aspect, the ratio (Cpc/Cnc) of correction capacitances of the capacitor 350A and the capacitor 355A is equivalent to a ratio (Cpp/Cpn) of the capacitances of the parasitic capacitor 340A and the parasitic capacitor 345A. Similarly, a ratio of the correction capacitances of the capacitor 350B and the capacitor 355B is equivalent to a ratio of the capacitances of the parasitic capacitor 340B and the parasitic capacitor 345B.

In some embodiments, the transistor 315A and the transistor 315B include positive metal oxide semiconductor (PMOS) type transistors, and the transistor 320A and the transistor 320B include negative metal oxide semiconductor (NMOS) type transistors.

The working of the amplifier 230 to prevent loading of the input circuit by enhancing the input resistance of the amplifier 230 is explained as follows: The transistor 315A, the transistor 320A, the transistor 315B, and the transistor 320B are biased using the biasing circuit 325. The input terminal 330A provides a positive input voltage signal to the gate of the transistor 315A via the capacitor 335A, and to the gate of the transistor 320A via the capacitor 335B. The transistor 315A and the transistor 320A are active. Similarly, the input terminal 330B provides a negative input voltage signal to the gate of the transistor 315B via the capacitor 335C, and to the gate of the transistor 320B via the capacitor 335D. The transistor 315B and the transistor 320B become active. The positive input voltage signal and the negative input voltage signal can be AC coupled RF signals transmitted from the input circuit 205.

A first current, corresponding to the parasitic capacitor 340A of the transistor 315A, flows from the input terminal 330A through the capacitor 335A, the gate of the transistor 315A, and the parasitic capacitor 340A towards the output terminal 310A. A second current, corresponding to the parasitic capacitor 345A of the transistor 320A, flows from the input terminal 330A through the capacitor 335B, the gate of the transistor 320A, and the parasitic capacitor 345A towards the output terminal 310A. A third current, corresponding to the parasitic capacitor 340B of the transistor 315B, flows from the input terminal 330B through the capacitor 335C, the gate of the transistor 315B, and the parasitic capacitor 340B towards the output terminal 310B. A fourth current, corresponding to the parasitic capacitor 345B of the transistor 320B, flows from the input terminal 330B through the capacitor 335D, the gate of the transistor 320B, and the parasitic capacitor 345B towards the output terminal 310B. The parasitic capacitance of each transistor degrades performance of the amplifier 230. The first pair of capacitors defines paths for correction currents. The correction currents are equal in magnitude and opposite in polarity to currents flowing due to corresponding parasitic capacitances of the first pair of transistors 305A. In one example, the capacitor 350A defines a path for a first correction current which is equal in magnitude and opposite in polarity to the first current flowing through the parasitic capacitor 340A. The first correction current flows from the output terminal 310B, the capacitor 350A, and the gate of the transistor 315A to reduce performance degradation due to the first current. In another example, the capacitor 355A defines a path for a second correction current which is equal in magnitude and opposite in polarity to the second current flowing through the parasitic capacitor 345A. The second correction current flows from the output terminal 310B, the capacitor 355A, and the gate of the transistor 320A to reduce performance degradation due to the second current. The second pair of capacitors defines paths for correction currents. The correction currents are equal in magnitude and opposite in polarity to currents flowing through corresponding parasitic capacitances of the second pair of transistors 305B. In one example, the capacitor 350B defines a path for a third correction current which is equal in magnitude and opposite in polarity to the third current flowing through the parasitic capacitor 340B. The third correction current flows from the output terminal 310A, the capacitor 350B, and the gate of the transistor 315B to reduce performance degradation due to the third current. In another example, the capacitor 355B defines a path for a fourth correction current which is equal in magnitude and opposite in polarity to the fourth current flowing through the parasitic capacitor 345B. The fourth correction current flows from the output terminal 310A, the capacitor 355B, and the gate of the transistor 320B to reduce performance degradation due to the fourth current.

The input resistance Rin is enhanced by an equivalent correction capacitance (Cc) and is determined as $$Rin = \text{real}\left[\frac{1}{((1 + gm \times Zo) \times s \times Cp) + ((1 - gm \times Zo) \times s \times Cc)}\right] \quad (2)$$

where gm is transconductance of the amplifier 230, Zo is impedance of the load 360, Cp (Cpp+Cpn) is equivalent parasitic capacitance of either the transistor 315A and the transistor 320A or the transistor 115 and the transistor 120, Cc (Cpc+Cnc) is the equivalent correction capacitance of either the capacitor 350A and the capacitor 355A or the capacitor 350B and the capacitor 355B, and represents complex frequency and can be determined as s=j*2*pi*f, where f is frequency. The enhancement in the input resistance can also be referred to as minimization of or prevention of degradation of the input resistance at the input terminal 330A and the input terminal 330B.

In some embodiments, when the biasing circuit 325 includes the DAC to control the common mode voltage then the biasing circuit can be referred to as a control circuit. The control circuit is explained in FIG. 4.

Figure 4:
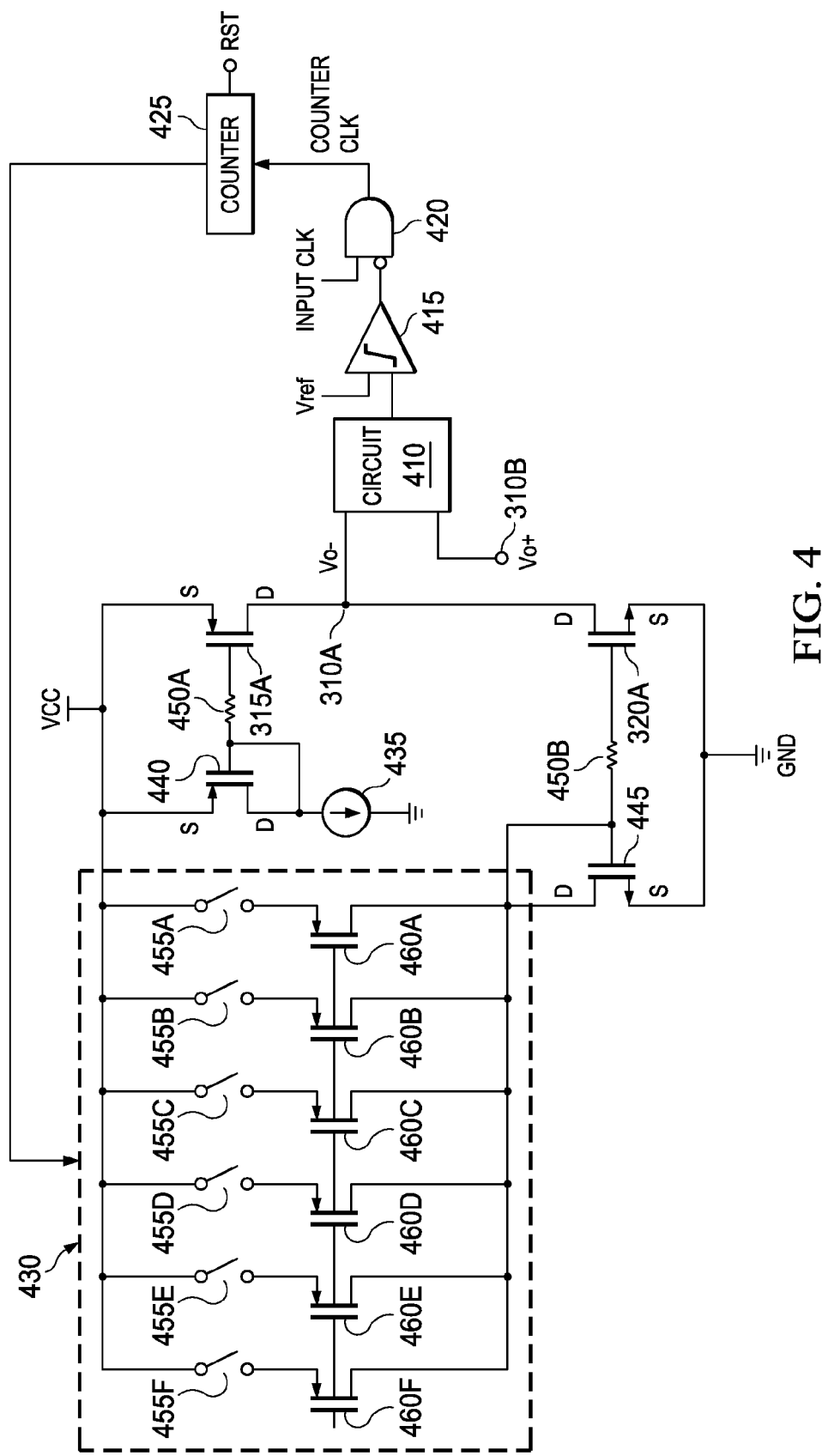
FIG. 4 illustrates a control circuit for controlling a common mode voltage associated with an output of a circuit, in accordance with one embodiment.

Referring now to FIG. 4, a control circuit includes a circuit 410 coupled to output terminals, for example the output terminal 310A and the output terminal 310B, of a circuit, for example the amplifier 230. The transistor 315A and the transistor 320A define the first output (Vo−) at the output terminal 310A. Similarly, the transistor 315B (not shown) and the transistor 320B (not shown) define the second output (Vo+) at the output terminal 310B. The circuit 410 is coupled to a comparator 415. The comparator 415 is coupled to a clock 420. The clock 420 is coupled to a counter 425 which in turn is coupled to a current source, for example a digital-to-analog converter (DAC) 430. The DAC 430 includes one or more switches, for example a switch 455A, a switch 455B, a switch 455C, a switch 455D, a switch 455E, and a switch 455F. The DAC 430 also includes one or more transistors, for example a transistor 460A, a transistor 460B, a transistor 460C, a transistor 460D, a transistor 460E, and a transistor 460F, having drains coupled to a diode 445, for example a transistor diode, and sources coupled to corresponding switches, for example a source of the transistor 460F is coupled to the switch 455F. The diode 445 has a gate coupled to the gate of the transistor 320A through a resistor 450B and a source coupled to the ground supply (GND). A diode 440, for example a transistor diode, has a gate coupled to the gate of the transistor 315A through a resistor 450A, and a source coupled to the voltage supply (VCC). A current source 435 is coupled between a drain of the diode 440 and the ground supply.

In some embodiments, the control circuit includes the circuit 410, the comparator 415, the clock 420, the counter 425, the DAC 430, the diode 445, the diode 440, the current source 435, resistor 450A, and the resistor 450B. In some embodiments, the circuit 410 includes one or more passive elements, for example a plurality of resistors. In some embodiments, the diode 445, also referred to as a biasing element, is an NMOS type transistor and the diode 440 is a PMOS type transistor.

The circuit 410 determines the common mode voltage by averaging the first output and the second output. The comparator 415 compares the common mode voltage with a reference voltage. The comparator 415 provides a comparator output to the clock 420 based on the comparison. The comparator output includes a transition when the common mode voltage crosses the reference voltage. The clock 420 receives a clock input (INPUT CLK) and the comparator output, and generates a clock signal (COUNTER CLK) for the counter 425. The counter 425 enables configuration of the DAC 430 in response to the clock signal by controlling the switches. The switches are closed one by one and the comparator output is observed using the counter 425. The counter 425 can be reset using a reset pin (RST). The switches control flow of current in the DAC 430 which in turn controls the biasing of the transistor 320A. The DAC 430, in conjunction with the diode 445, prevents deviation in start time of operation of the transistor 320A and also accommodates variation in the common mode voltage occurring due to deviation in start time of operation of the transistor 315A. The counter 425 configures the DAC 430 to a setting that exists when the comparator output includes the transition.

In some embodiments, the DAC 430 is a 6 bit DAC. In some embodiments, the current source 435 is a fixed current source which is used to bias the transistor 315A.

It is noted that the control circuit is explained in conjunction with the transistor 320A and the transistor 315A. Similar or different control circuit can be used for the transistor 320B (not shown) and the transistor 315B (not shown).

Figure 5:
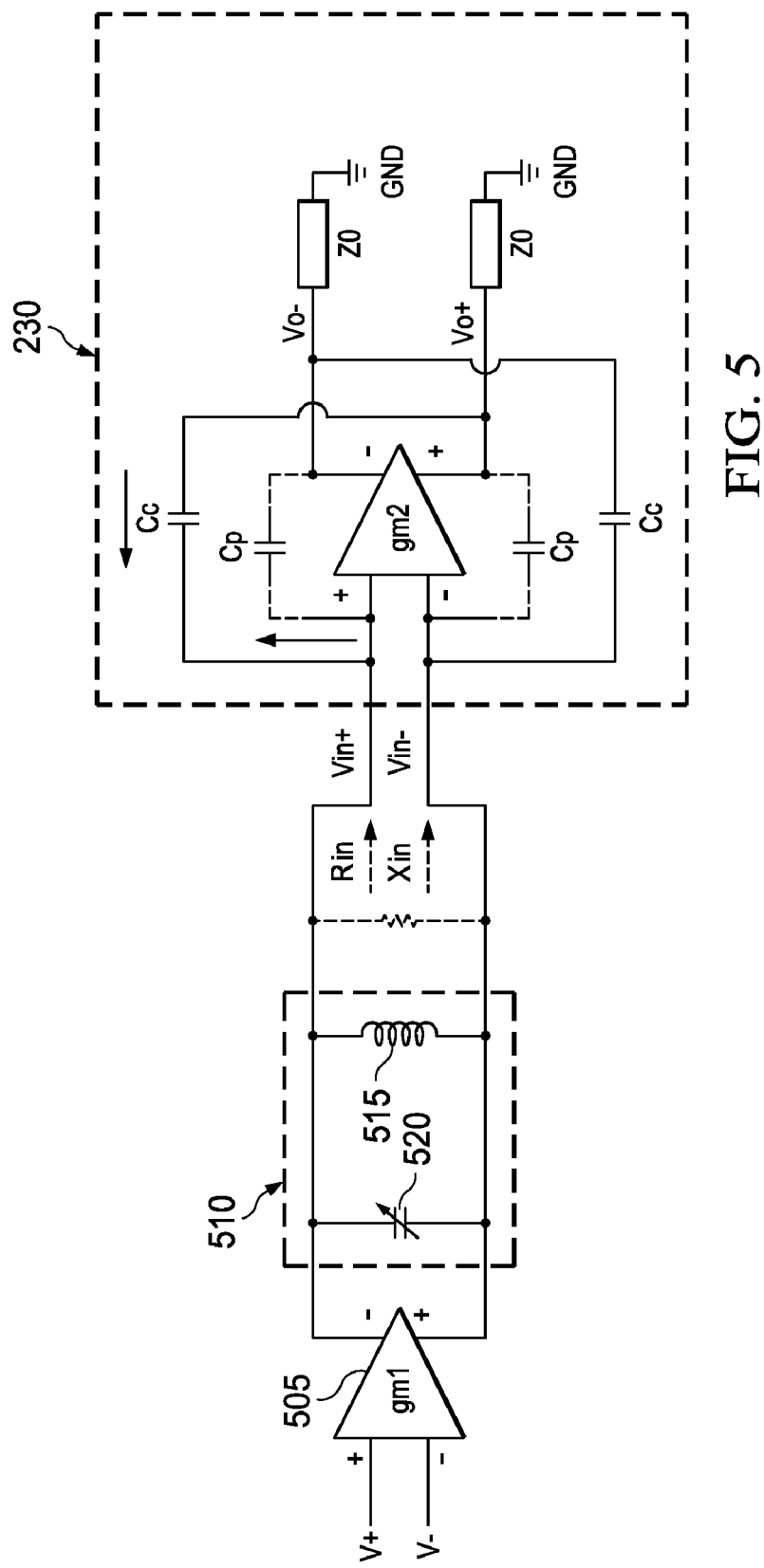
FIG. 5 illustrates an equivalent circuit of a two stage amplifier, in accordance with one embodiment.

FIG. 5 illustrates an equivalent circuit of a two stage amplifier. The two stage amplifier includes an amplifier 505 in an input stage with a transconductance gm1 and the amplifier 230 with a transconductance gm2 in an output stage. The amplifier 505 is coupled to a tuning circuit 510 which is a parallel connection of an inductor 515 and a capacitor 520. The amplifier 505 provides an amplified output as an input to the amplifier 230. The presence of a current due to the equivalent parasitic capacitance (Cp) of the amplifier 230 in the output stage is nullified by a correction current due to the equivalent correction capacitance (Cc) by enhancing the input resistance (Rin). The enhancement of Rin improves frequency selectivity and gain of the amplifier 230.

Figure 6:
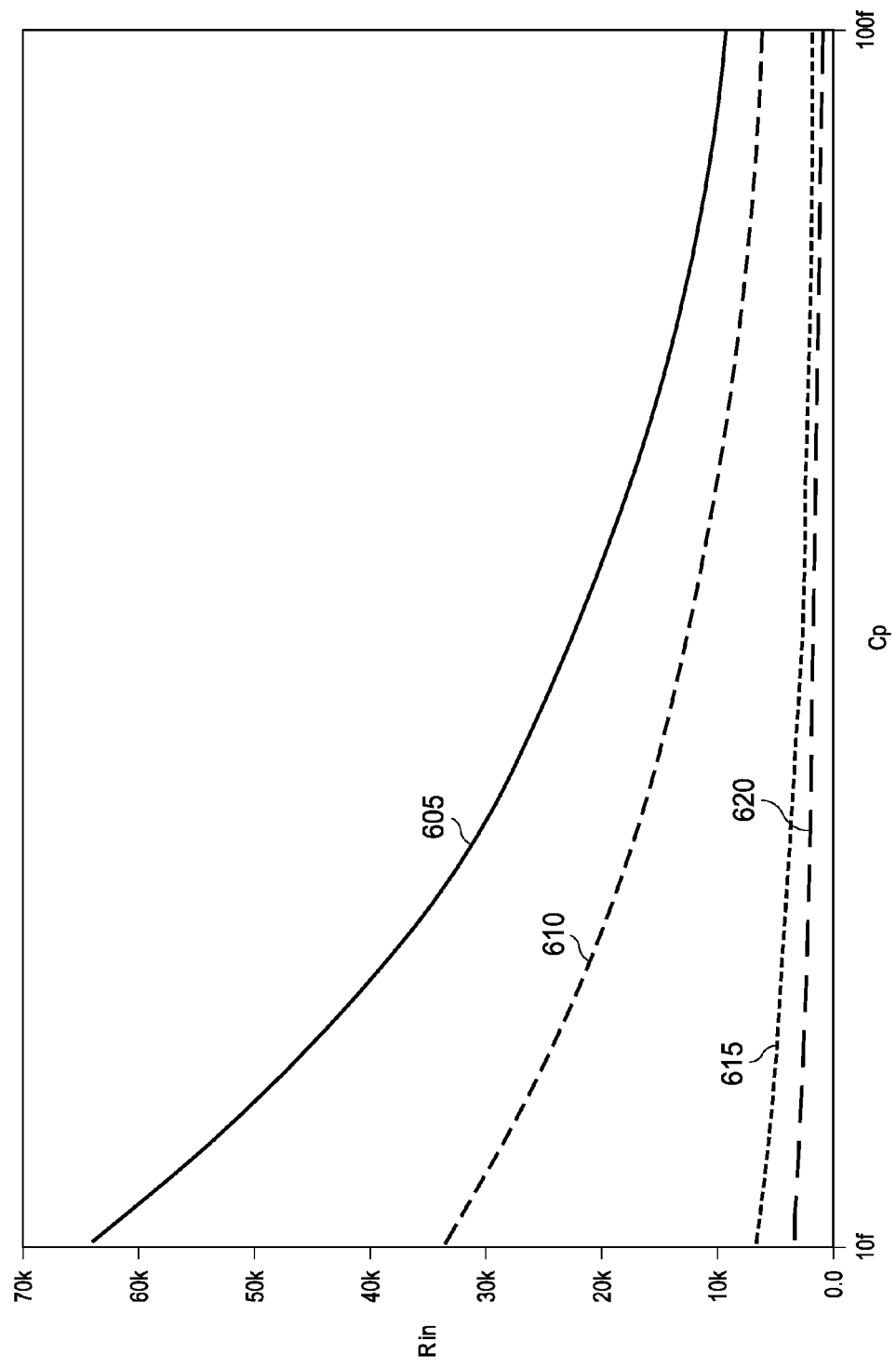
FIG. 6 is an exemplary representation illustrating reduced effect of equivalent parasitic capacitance on input resistance, in accordance with one embodiment.

FIG. 6 is an exemplary representation illustrating reduced effect of the equivalent parasitic capacitance (Cp) on the input resistance (Rin) in comparison with prior art. X axis represents variation in the equivalent parasitic capacitance from 10 fifo farads (fF) to 100 fF. Y axis represents variation in the input resistance from 0 kilo ohms to 70 kilo ohms. A waveform 605 corresponds to the input resistance at 2.5 Giga Hertz (GHz) and a waveform 610 corresponds to the input resistance at 5 GHz for the amplifier 230. The input resistance of the amplifier 230 enhances the gain of the input circuit 205. A waveform 615 corresponds to the input resistance at 2.5 GHz and a waveform 620 corresponds to the input resistance Rin at 5 GHz for the prior art. The input resistance corresponding to the waveform 605 is higher as compared to the input resistance corresponding to the waveform 615 for a given value of Cp. Similarly, the input resistance corresponding to the waveform 610 is higher as compared to the input resistance corresponding to the waveform 620 for the given value of Cp.

Figure 7:
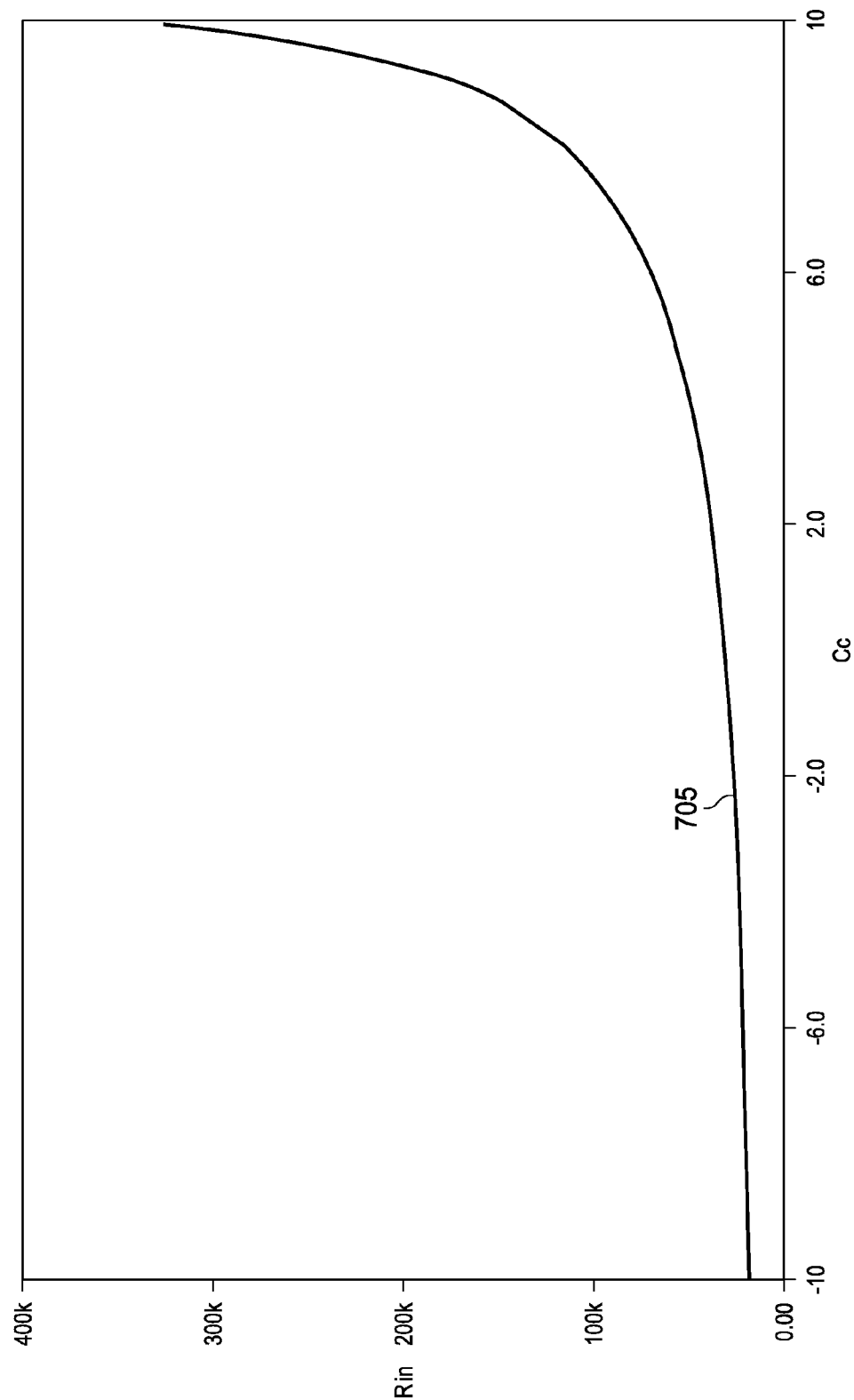
FIG. 7 is an exemplary representation illustrating enhanced effect of an equivalent correction capacitance on input resistance, in accordance with one embodiment.

FIG. 7 is an exemplary representation illustrating enhanced effect of the equivalent correction capacitance (Cc) on the input resistance (Rin) for an exemplary performance range. X axis represents a variation of the equivalent correction capacitance from a required value by −10% or +10%. The required value can be approximately equal to the equivalent parasitic capacitance. A waveform 705 corresponds to a variation in the input resistance corresponding to change in the equivalent correction capacitance. Increase in the input resistance is directly proportional to the increase in the equivalent correction capacitance.

Figure 8:
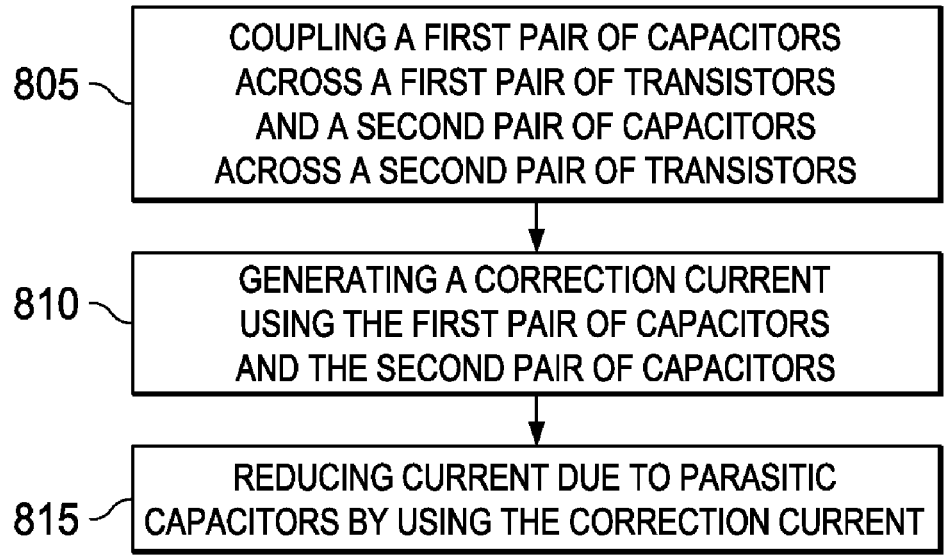
FIG. 8 is a flow diagram illustrating a method for controlling loading of an input circuit, in accordance with one embodiment.

FIG. 8 is a flow diagram illustrating a method for controlling loading of an input circuit, for example a low noise amplifier. The controlling helps in achieving a desired gain, and improves frequency selectivity and noise performance. The loading of the input circuit can be controlled using an amplifier, for example a radio frequency (RF) amplifier, coupled to the output of the input circuit. The amplifier includes a first pair of transistors, hereinafter referred to as the first pair, and a second pair of transistors, hereinafter referred to as the second pair.

At step 805, a first pair of capacitors is coupled across the first pair and a second pair of capacitors is coupled across the second pair. The first pair is responsive to a positive input to define a first output. The second pair is responsive to a negative input to define a second output. Parasitic capacitance between a gate and a drain of each transistor generates a current which in turn degrades an input resistance of the amplifier.

At step 810, a correction current is generated using the first pair of capacitors and the second pair of capacitors. In order to reduce the degradation of the input resistance of the amplifier, the correction current is generated. The correction current is associated with the first output and the second output, and flows through respective capacitors.

At step 815, the current is reduced by using the correction current. The correction current can be equal and opposite to the current due to corresponding parasitic capacitance.

The correction current decreases the effect of the parasitic capacitance and increases the input resistance. The increase in the input resistance improves gain of the amplifier and prevents loading of the input circuit.

Figure 9:
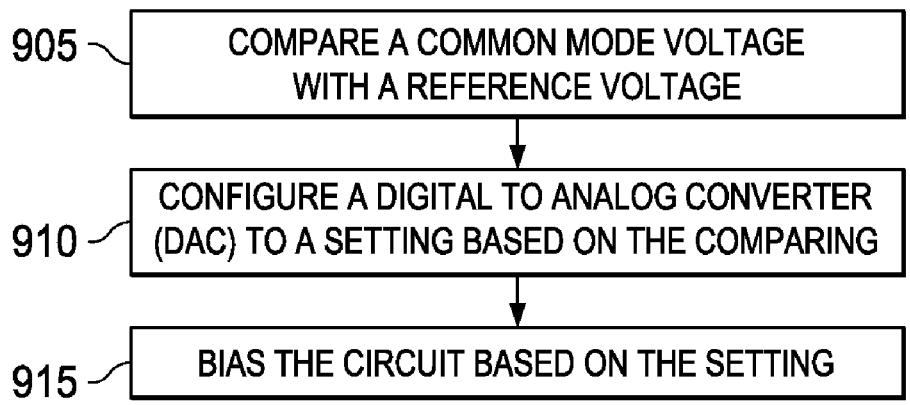
FIG. 9 is a flow diagram illustrating a method for controlling a common mode voltage of a circuit, in accordance with one embodiment.

FIG. 9 illustrates a method for controlling a common mode voltage of a circuit. The circuit, for example an amplifier, includes two pairs of transistors, for example a first pair of transistors, hereinafter referred to as the first pair, and a second pair of transistors, hereinafter referred to as the second pair. The first pair defines a first output and the second pair defines a second output. The common mode voltage can be defined as average of the first output and the second output.

At step 905, the common mode voltage is compared with a reference voltage. A comparator can be used to compare the common mode voltage with the reference voltage. The reference voltage can be equal to half the magnitude of the voltage supply.

At step 910, a digital-to-analog converter (DAC), for example the DAC 430, is configured to a setting based on the comparing. The setting corresponds to crossing of the reference voltage by the common mode voltage. The crossing can be determined, for example by using the comparator. A transition at a comparator output can indicate the crossing.

In one embodiment, a digital block including a clock and a counter is used in combination to enable the configuring of the DAC.

In another embodiment, software or firmware can be used to configure the DAC.

At step 915, the circuit is biased based on the setting. The DAC, after being set, is used for biasing the circuit to control the common mode voltage. The configuring of the DAC helps in controlling current through the DAC, and biasing of the first pair and the second pair. The biasing in turn controls the common mode voltage by controlling input to the DAC.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. An amplifier comprising:
a first pair of transistors that defines a first output terminal, each transistor of the first pair of transistors having a gate coupled to a first input terminal;
a second pair of transistors that defines a second output terminal, each transistor of the second pair of transistors having a gate coupled to a second input terminal;
a first pair of capacitors that minimizes degradation of input resistance at the first input terminal, a first capacitor of the first pair of capacitors coupled to the second output terminal and to the gate of a first transistor of the first pair of transistors, and a second capacitor of the first pair of capacitors coupled to the second output terminal and to the gate of a second transistor of the first pair of transistors; and
a second pair of capacitors that minimizes degradation of the input resistance at the second input terminal, a third capacitor of the second pair of capacitors coupled to the first output terminal and to the gate of a third transistor of the second pair of transistors, and a fourth capacitor of the second pair of capacitors coupled to the first output terminal and to the gate of a fourth transistor of the second pair of transistors.

2. The amplifier as claimed in claim 1, wherein
the first pair of capacitors defines paths for correction currents, the correction currents being equal in magnitude and opposite in polarity to currents flowing due to corresponding parasitic capacitances of the first pair of transistors; and
the second pair of capacitors defines paths for correction currents, the correction currents being equal in magnitude and opposite in polarity to currents flowing due to corresponding parasitic capacitances of the second pair of transistors.

3. The amplifier as claimed in claim 1 and further comprising:
a biasing circuit, coupled to the first pair of transistors and the second pair of transistors, that biases the first pair of transistors and the second pair of transistors.

4. The amplifier as claimed in claim 3, wherein the biasing circuit comprises:
a pair of diodes; and
a pair of current sources coupled to the pair of diodes.

5. The amplifier as claimed in claim 4, wherein the pair of current sources comprises:
at least one digital to analog converter that controls a common mode voltage associated with the first output terminal and the second output terminal.

6. The amplifier as claimed in claim 5 and further comprising:
a comparator, coupled to the first output terminal and the second output terminal, that compares the common mode voltage with a reference voltage.

7. The amplifier as claimed in claim 1, wherein
the first transistor and the third transistor comprise positive metal oxide semiconductor (PMOS) type transistors, and
the second transistor and the fourth transistor comprise negative metal oxide semiconductor (NMOS) type transistors.

8. The amplifier as claimed in claim 1, wherein the amplifier comprises an output stage amplifier of a multistage amplifier circuit.

9. The amplifier as claimed in claim 1, wherein the amplifier is coupled to an input circuit, the amplifier functioning as a load to the input circuit and reducing loading of the input circuit by generating correction currents using the first pair of capacitors and the second pair of capacitors.

* * * * *